United States Patent [19]
Jekat

[11] 3,946,209
[45] Mar. 23, 1976

[54] HIGH FREQUENCY COUNTER HAVING SIGNAL LEVEL SENSITIVITY

[75] Inventor: Hans Jekat, Redwood City, Calif.

[73] Assignee: Hewlett-Packard Company, Palo Alto, Calif.

[22] Filed: Oct. 7, 1974

[21] Appl. No.: 512,653

[52] U.S. Cl. ... 235/92 DE; 235/92 BN; 235/92 LG; 328/39; 328/169
[51] Int. Cl.² .......................................... H03K 21/02
[58] Field of Search ...... 235/92 DE, 92 BN, 92 CC, 235/92 DM, 92 LG, 92 R; 328/39, 41, 169, 173, 175

[56] References Cited
UNITED STATES PATENTS

| | | | |
|---|---|---|---|
| 3,177,474 | 4/1965 | Wagner | 235/92 LG |
| 3,614,631 | 10/1971 | BeVier et al. | 235/92 DM |
| 3,632,996 | 1/1972 | Paine et al. | 235/92 DE |
| 3,813,526 | 5/1974 | Watson et al. | 235/92 DM |

Primary Examiner—Gareth D. Shaw
Assistant Examiner—John P. Vandenburg
Attorney, Agent, or Firm—A. C. Smith

[57] ABSTRACT

An improved circuit at the input of a high frequency counter includes a bias-sensitive binary divider in the input stage and includes circuitry for altering the bias on the binary divider to change sensitivity automatically as a function of applied signal level.

3 Claims, 3 Drawing Figures

HIGH FREQUENCY COUNTER HAVING SIGNAL LEVEL SENSITIVITY

BACKGROUND OF THE INVENTION

Certain known high frequency counting circuits utilize Schmitt trigger circuits for toggling following counter stages in response to each event of the applied signal level crossing selected reference signal levels. One difficulty encountered with trigger circuits of this type which use contemporary components is that reliable triggering operation is impaired at the upper frequency limit of the Schmitt trigger circuit. In addition, recurring gating signals and associated counteroperating signals in conventional counters make it difficult to determine the frequency of signals appearing in bursts.

SUMMARY OF THE INVENTION

Accordingly, the present invention utilizes a binary divider in the input stage, and includes a control circuit for altering the bias on the binary divider stage in response to applied signal of adequate amplitude for proper divider and count-gate operation. At insufficient levels of applied signal, the present circuit maintains sufficient bias on the binary divider stage to prevent random divider operation. This obviates improper divider operation due, for example, to noise appearing on a low-level signal, while permitting proper counter operation on intermittent, higher level signals.

DESCRIPTION OF THE PREFERRED EMBODIMENT

Figure 1:
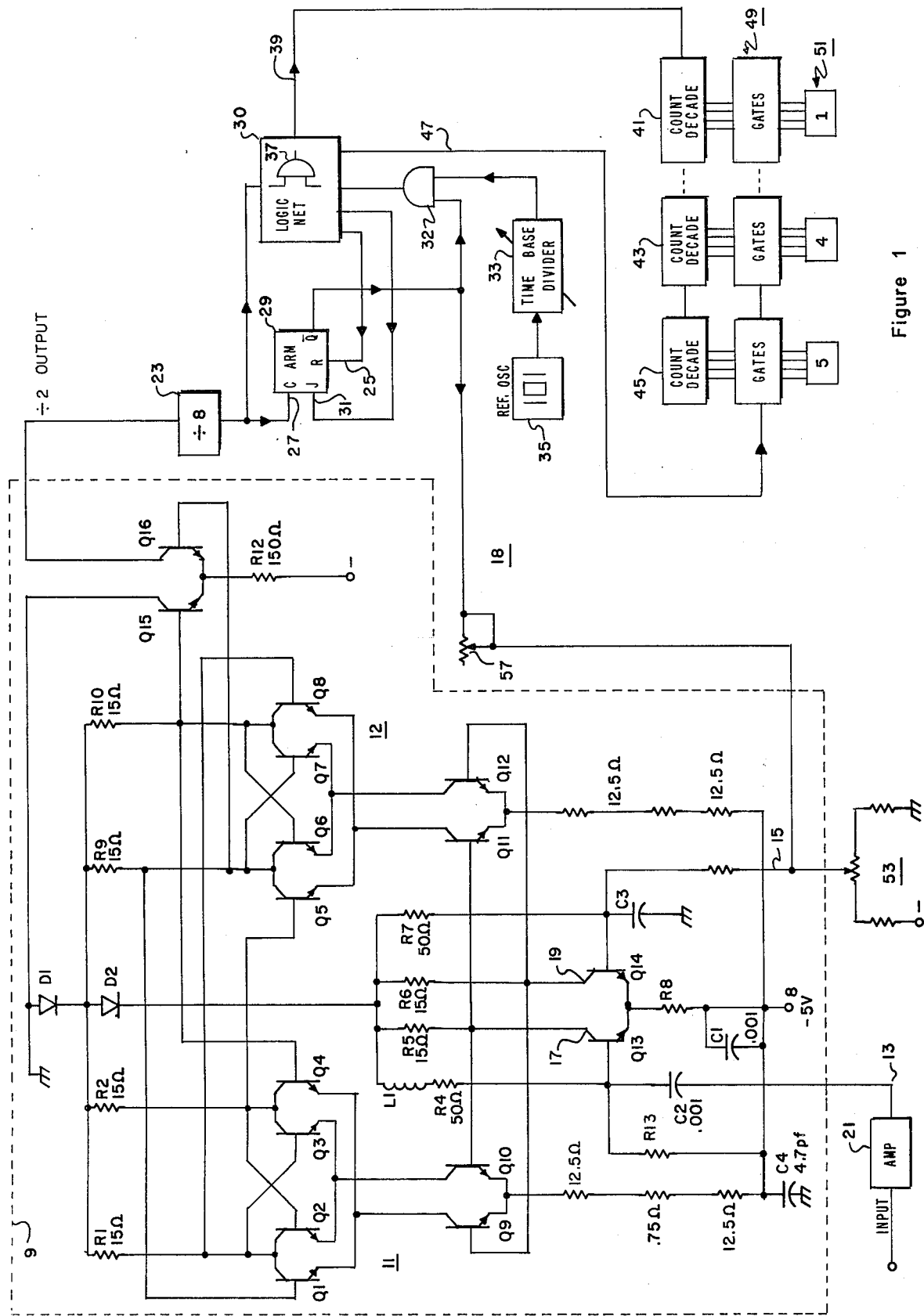
FIG. 1 is a schematic diagram of the counter of the present invention.

Referring now to FIG. 1, there is shown a binary divider stage 9 having a pair of inputs 13 and 15 and including a pair of transistors 17 and 19 connected in a differential amplifier configuration to serve as the steering mechanism for the following master-slave flip-flops 11, 12. Input signal is applied to the input 13 via amplifier 21 and bias signal is applied through input 15 via feedback circuit 18, later described.

Figure 3:
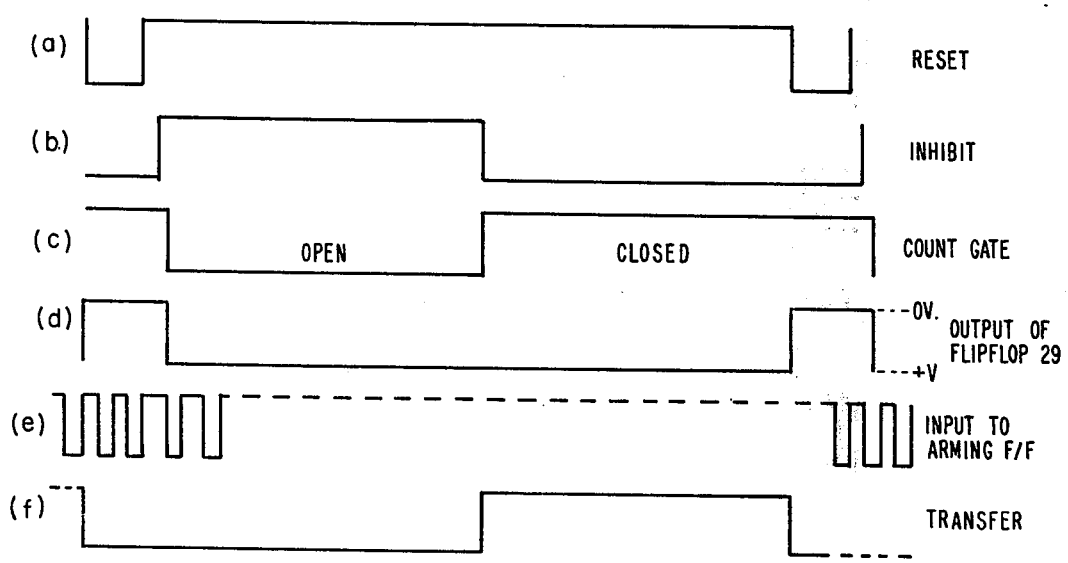
FIG. 3 is a graph showing various operating waveforms present in the circuit of FIG. 1.

The binary divider stage 9 is followed by a prescaler 23 which thus applies the divided input signal to the clock input 27 of the J-K type arming flip-flop 29. Flip-flop 29 also receives an inhibit signal (FIG. 3b) at the J input 31 and a reset signal (FIG. 3a) at the R input 25. These signals (FIGS. 3a and 3b) are derived from a logic network 30 which also receives the output from prescaler 23. The $\bar{Q}$ output of J-K flip-flop 29 is applied back to the input 15 of the binary stage 9 via feedback circuit 18, and is also applied to gate 32 to control application of the divided time-base oscillator signal to the logic network 30. This means that the gate 32 will not open unless the arm flip-flop 29 is actuated, and the divided input signal does not arrive at the arming flip-flop 29 in order to actuate it unless the bias conditions on the input stage 9 are overcome. If the input signal overcomes the bias condition on the input stage 9, then the divided signal (FIG. 3e) arriving at the input of the arming flip-flop 29 will latch up this flip-flop until reset by the reset signal (FIG. 3a) that is applied to the reset input 25. The $\bar{Q}$ output of the arm flip-flop 29 will thus remain in the "high" state during the interval before reset signal is applied, and this "high" state controls both the condition of gate 32 and the bias condition at the input stage 9.

The $\bar{Q}$ output from flip-flop 29 enables the gate 32 to pass the divided reference pulses from reference oscillator 35 to the logic network 30. The time-base divider circuit 33 may be selectively set, for example by decadic steps, to establish the countgate interval and may include a stage of division-by-sixteen to match the signal division attributable to the binary divider 9 and prescaler divider 23.

The logic network 30 includes a count gate 37 which controls the counting interval (FIG. 3c) and is connected to pass the prescaled signal at the output of prescaler 23 in response to the divided reference pulses from oscillator 35 and divider 33 that are passed by the armed gate 32. The gated, prescaled pulses 39 are then applied to the counting decades 41, 43, 45, etc. for counting therein in conventional decadic manner. After the gated counting interval expires, the logic network 30 produces a transfer pulse (FIG. 3f) of line 47 for application to the row of count-transfer gates 49. When thus enabled, these count-transfer gates transfer the count state of the associated count decade to the corresponding one of the row of display devices 51 in a conventional manner. The logic network 30 also produces in a conventional manner an inhibit signal (FIG. 3b) in the timed sequence with respect to the count-gate interval (FIG. 3c), which inhibit signal is applied to the J input of the J-K type arm flip-flop 29 in order to "lock" the flip-flop so that it cannot toggle back on recurring applied signals. Additionally, the logic network produces in a conventional manner a reset signal (FIG. 3e) which is applied to the reset input of the arm flip-flop 29 in the timed sequence shown in FIG. 3. The logic network 30 may therefore include a series of monostable multivibrations successively triggered, starting with the closing of the count gate, in order to generate the requisite transfer, reset, and inhibit pulses in the sequence shown in FIG. 3.

Figure 2:
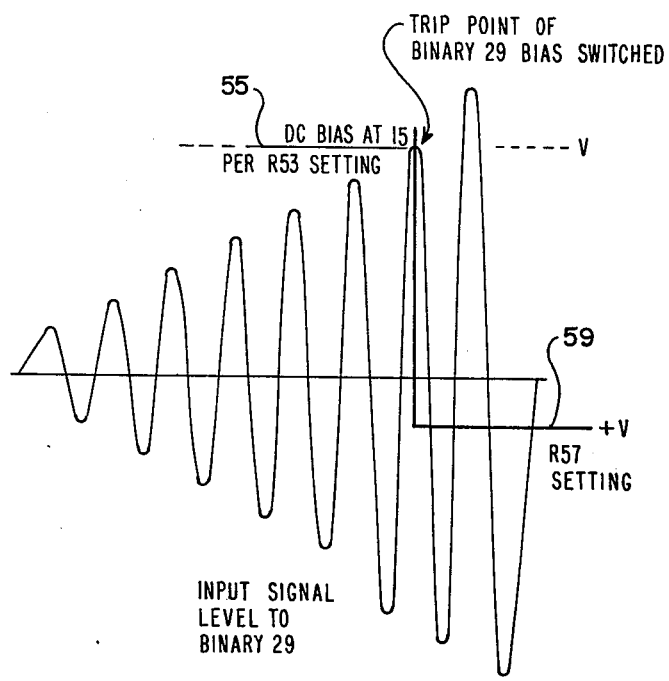
FIG. 2 is a graph showing the application of varied bias signal to the input binary divider.

Thus, the $\bar{Q}$ output from the arm flip-flop 29 enables the decade counters 41-45 to count for a gated counter interval, after which interval the bias conditions on the input stage 9 must again be overcome by the input signal. As previously indicated, this bias condition on the input stage is determined by the feedback circuit 18 from the $\bar{Q}$ output of flip-flop 29. The feedback circuit includes an adjustable voltage divider circuit 53 which applies a small offset bias to input 15 of the differential amplifier stages 17 and 19. These stages, which serve to steer triggering signals to the master and slave flip-flops 11 and 12, will thus prevent the binary stage from triggering on low level noise in a manner which causes oscillation of the input stage. The offsetting bias applied to input 15 may only be overcome to allow binary division by the input stage 9 in response to an input signal of sufficient magnitude, as shown in FIG. 2, applied to input 13. When the input signal exceeds the level 55 of the offsetting bias, then the input stage is actuated to divide by two and the resulting output therefrom is applied through prescaler 23 to the clock input of arming flip-flop 29 to trigger the same, as previously described. The "high" state $\bar{Q}$ output is then fed back with a magnitude determined by adjustment of resistor 57 to decrease the offsetting bias to a new lower level 59 during the count-gate interval (FIG. 3c).

This bias adjustment on input stage 9 thus occurs in each count-gate interval for which the applied input signal has sufficient magnitude to overcome the offset bias on input 15. If the input signal amplitude subsequently decreases below the offset bias level 55, then the input stage 9 will not trigger and gate 32 will therefore not be enabled. The logic network 30 will not receive reference pulses from the oscillator 35 and time-base divider 33, and will therefore not produce new reset, inhibit and transfer signals on lines 25, 31 and 47, respectively. The last count displayed on the display devices 51 will therefore be retained unaltered until input signal of sufficient amplitude to overcome the offsetting bias is again applied to input 13.

I claim:

1. Trigger circuitry comprising:

trigger means having one input connected to receive a source of bias signal and having another input connected to receive input signal and being operable in one logic state identified by an output of one logic level and in another logic state identified by an output of another logic level, said trigger means being actuated to operate in either one of two logic states in response to input signal applied to said other input with an amplitude greater than a signal level proportional to the amplitude of bias signal applied to said one input;

bistable means connected to receive the output of said trigger means and operable in one logic state identified by an output of one logic level until reset to another logic state identified by an output of another logic level, said bistable means being actuated to operate in said one logic state in response to an output received from said trigger means, and being actuated to operate in said other logic state in response to a reset signal applied thereto;

biasing means connected to apply to said one input of the trigger means a bias signal of one level in response to operation of said bistable means in said other logic state, and of another level lower than said one level in response to operation of said bistable means in said one logic state;

a source of reference signals;

gate means responsive to the output of the bistable means for passing reference signals therethrough in response to operation of the bistable means in said one logic state;

logic means coupled to receive the reference signals passed by said gate means for transmitting therethrough the outputs from said trigger means for a selected gate period, and for applying to said bistable means a reset signal after said selected gate period to reset said bistable means to said other logic state; and counting means connected to said logic means for providing an indication of the accumulated number of pulses transmitted through said logic means during a gate period.

2. Trigger circuitry as in claim 1 wherein said bistable means comprises a J-K type multivibrator circuit having a $\bar{Q}$ output coupled to said biasing means.

3. Trigger circuitry as in claim 1 wherein said trigger means includes a pair of bistable multivibrators connected to receive triggering signals in common from the collector circuits of a pair of transistors connected as a differential amplifier in common emitter configuration and including a base circuit of one transistor connected to receive the input signal, and a base circuit of the other transistor connected to receive bias signal from said biasing means.

* * * * *